United States Patent
Morvan (10) Patent No.: US 10,050,137 B2
(45) Date of Patent: Aug. 14, 2018

(54) ENHANCED NORMALLY-OFF HIGH ELECTRON MOBILITY HETEROJUNCTION TRANSISTOR

(71) Applicant: Commissariat A L'Energie Atomique et aux Energies Alternatives, Paris (FR)

(72) Inventor: Erwan Morvan, Montagne (FR)

(73) Assignee: Commissariat A L'Energie Atomique et aux Energies Alternatives, Paris (FR)

(\*) Notice: Subject to any disclaimer, the term of this patent is extended or adjusted under 35 U.S.C. 154(b) by 0 days.

(21) Appl. No.: 15/424,000

(22) Filed: Feb. 3, 2017

(65) Prior Publication Data

US 2017/0229567 A1    Aug. 10, 2017

(30) Foreign Application Priority Data

Feb. 4, 2016 (FR) ...................... 16 50901

(51) Int. Cl.
*H01L 29/778* (2006.01)
*H01L 29/205* (2006.01)
(Continued)

(52) U.S. Cl.
CPC ...... *H01L 29/7786* (2013.01); *H01L 29/2003* (2013.01); *H01L 29/205* (2013.01); *H01L 29/207* (2013.01); *H01L 29/4236* (2013.01)

(58) Field of Classification Search
CPC ............. H01L 29/7786; H01L 29/4236; H01L 29/205; H01L 29/2003; H01L 29/207; H01L 29/66143; H01L 21/8252; H01L 27/0629; H01L 29/1095; H01L 29/66522; H01L 29/66734; H01L 29/7806; H01L 29/7813; H01L 21/0254; H01L 29/872; H01L 21/0237; H01L 21/0242; H01L 21/02458; H01L 21/02502;
(Continued)

(56) References Cited

U.S. PATENT DOCUMENTS 5,543,637 A    8/1996 Baliga
2011/0068371 A1    3/2011 Oka
(Continued)

OTHER PUBLICATIONS

French Preliminary Search Report dated Nov. 28, 2016 in French Application 16 50901, filed on Feb. 4, 2016 (with English translation of Categories of Cited Documents & Written Opinion).
(Continued)

*Primary Examiner* — Caleen Sullivan
(74) *Attorney, Agent, or Firm* — Oblon, McClelland, Maier & Neustadt, L.L.P (57) ABSTRACT

A high electron mobility field-effect transistor of normally-off type, including a first layer of GaN with P-type doping; a second layer of GaN with N-type doping formed on the first layer of GaN; a third layer of unintentionally doped GaN formed on the second layer of GaN; a semiconductor layer formed to form an electron gas layer; a cavity formed through the third layer of GaN, without reaching the bottom of the second layer of GaN; a gate including a conductive gate material and a gate insulation layer arranged in the cavity, the gate insulation layer electrically insulating the conductive gate material relative to the second and third layers of GaN.

18 Claims, 5 Drawing Sheets

(51) Int. Cl.
*H01L 29/207* (2006.01)
*H01L 29/20* (2006.01)
*H01L 29/423* (2006.01)

(58) Field of Classification Search
CPC ............. H01L 21/02576; H01L 29/861; H01L 29/868; C30B 25/02; C30B 29/40; C30B 29/406
USPC .......................................................... 257/76
See application file for complete search history.

(56) References Cited

U.S. PATENT DOCUMENTS

| | | | |
|---|---|---|---|
| 2011/0272708 A1* | 11/2011 | Yoshioka | H01L 21/28264 257/77 |
| 2014/0004669 A1 | 1/2014 | Oka | |
| 2015/0076508 A1* | 3/2015 | Saito | H01L 29/4236 257/76 |
| 2017/0148908 A1* | 5/2017 | Yumoto | H01L 29/7806 |

OTHER PUBLICATIONS

Maojun Wang et al. "Normally-Off Hybrid Al$_2$O$_3$/GaN MOSFET on Silicon Substrate Based on Wet-Etching", Proceedings of the 26$^{th}$ International Symposium on Power Semiconductor Devices & IC's, 2014, 4 pages.

Naresh Thapar et al. "Analytical Model for the Threshold Voltage of Accumulation Channel Mos-Gate Devices", Solid-State Electronics, vol. 42, No. 11, 1998, 5 pages.

Praveen M. Shenoy et al. "The Planar 6H-SiC Accufet: A New High-Voltage Power MOSFET Structure", IEEE Electron Device Letters, vol. 18, No. 12, 1997, 3 pages.

* cited by examiner

ENHANCED NORMALLY-OFF HIGH ELECTRON MOBILITY HETEROJUNCTION TRANSISTOR

The invention relates to high electron mobility transistors based on the presence of heterojunctions, and in particular the HEMT transistors of normally-off type.

Many electronic applications now require enhanced performance levels, above all in the embedded electronics intended for motor vehicles and terrestrial transport, in aeronautics, in medical systems or in home automation solutions for example. These applications for the most part require switches for high power, operating in frequency ranges often above a megahertz.

Historically, power switches have for a long time used field-effect transistors based on a semiconductor channel, most often of silicon. For lower frequencies, the junction transistors are preferred because they withstand higher current densities. However, because of the relatively limited breakdown voltage of each of these transistors, the power applications require the use of a large number of transistors in series, or longer transistors, which culminates in a higher conducting resistance. The losses through these transistors in series are considerable, both in steady-state regime and in switching mode.

One alternative for power switches, in particular at high frequencies, is to use high electron mobility field-effect transistors, also designated by the term heterostructure field-effect transistor. Such a transistor includes the superposition of two semiconductor layers having different band gaps and exhibiting a bias which leads to the formation of a two-dimensional electron gas with high mobility and high density. For high voltage strength and temperature reasons, these transistors are fabricated using semiconductor materials of III-N type with wide band gap.

For some applications, in particular safety applications for isolating a circuit in case of malfunction of a control system, HEMT transistors are used that are of normally-off type, that is to say that their threshold voltage for switchover to the on state is positive, such that the transistor remains off in the absence of a control signal.

Because of the intrinsically conductive nature of the electron gas layer formed between a source and a drain, it is technologically easier to produce a heterojunction transistor of normally-on type. However, a number of fabrication methods have been developed for forming heterojunction transistors of normally-open, or normally-off, type.

It is known practice to produce control gates of Schottky type for heterojunction transistors of normally-off type. However, such transistors are unsuited to power electronics because of the current leakage levels between gate and drain and because of the sensitivity of the current/voltage curve to temperature. Different fabrication methods have also been developed for producing gates of MIS type for heterojunction transistors of normally-off type. This structure also makes it possible to drive the gate in positive and negative mode to remain compatible with the control electronics used for silicon power components.

According to one approach, a binary layer of III-type nitride and a ternary layer of III-type nitride are superposed to form an electron gas layer at the interface between these nitrides. An indentation is produced by etching in the ternary layer of nitride in order to locally reduce the thickness of this ternary layer. When the local thickness of the ternary layer of nitride is sufficiently low, for example from 2 to 3 nm for AlGaN, the electron gas disappears at the indentation. Then, the gate is formed at the indentation.

The process of etching of the indentation is as yet insufficiently controlled to guarantee a satisfactory thickness of the ternary layer of nitride in the indentation. According to an alternative described in particular in the document entitled "over 100 A operation normally-off AlGaN/GaN hybrid MOS-HFET on Si substrate with high-breakdown voltage" by Hiroshi Kambayashi et al., published in "Solid-State Electronics", volume 54, number 6, in June 2010, pages 660-664, the etching is done up to the binary layer of nitride. Such a structure makes it possible to obtain a threshold voltage higher than 3V. On the other hand, such a structure has the drawback of locally having an operation of MOSFET type with degraded density and above all charge mobility, and therefore a higher resistance in the on state.

The document US2011/068371 describes a high electron mobility field-effect transistor, comprising in particular:
a first layer of GaN;
a second layer of GaN with P-type doping formed on the first layer of GaN;
a third layer of GaN with N-type doping formed on the second layer of GaN so as to form a depleted p/n junction.

This document does not make it possible to ensure the complete depletion of the layer of GaN with P-type doping and does not allow for a good voltage strength and make it possible to obtain an adequate electric barrier. Moreover, this document raises problems of diffusion of the dopants towards the electron gas layer, with a significant electrical effect of these dopants on the electron gas layer.

The document "Normally-Off $Al_2O_3$/GaN MOSFET on Silicon Substrate based on Wet-Etching", published by Mrs Wang et al in pages 253-256 of the presentations disclosed in the context of the $25^{th}$ International Symposium Power Semiconductor Devices & IC's, which was held from 15 to 19 Jun. 2014 in Hawaii, describes a MOSFET transistor fabricated on a silicon substrate. The normally-open operation is obtained by a gate indentation using an oxidation and a wet etch for the removal of an AlGaN barrier.

The invention aims to resolve one or more of these drawbacks. The invention thus relates to a high electron mobility heterojunction transistor, as defined in claim 1.

The invention relates also to the variants of the attached claims. A person skilled in the art will understand that each of the features of the variants of the dependent claims can be combined independently with the above features, without in any way constituting an intermediate generalization.

Other features and advantages of the invention will clearly emerge from the description which is given thereof hereinbelow, in an indicative and nonlimiting manner, with reference to the attached drawings, in which.

Figure 1:
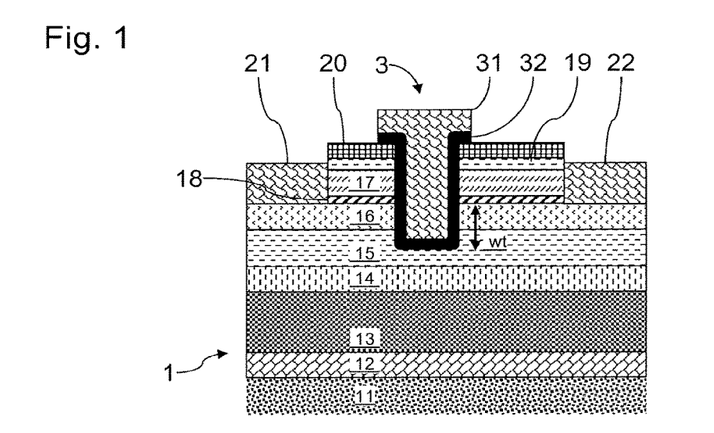
FIG. 1 is a cross-sectional view of an example of a high electron mobility heterojunction transistor according to the invention.

FIG. 1 is a schematic cross-sectional view of an example of a high electron mobility heterojunction transistor of normally-off type, according to an embodiment of the invention. The transistor 1 comprises a substrate 11, a nucleation layer 12 arranged on the substrate 11, a buffer layer of GaN 13 arranged on the nucleation layer 12, a layer of P-doped GaN 14 arranged on the buffer layer of GaN 13, a layer of N-doped GaN 15 arranged on the layer of GaN 14, and a layer of unintentionally doped GaN 16 arranged on the layer 15. The transistor 1 further comprises a layer of AlGaN 17 arranged on the layer 16. An electron gas is intrinsically formed by heterojunction at the interface between the layer 17 and the layer 16. For legibility, the electron gas is illustrated in the form of layer 18 at the interface between the layer 16 and the layer 17. An intermediate layer that is not illustrated can be interposed between the layers 16 and 17, for example to increase the electron density in the electron gas and enhance the containment of the electrons in the GaN. Such an intermediate layer is typically extremely thin (for example 1 nm) and can be produced in AlN (particularly suited to the interface between a layer 16 of GaN and a layer 17 of AlGaN). According to the invention, the layer 14 includes magnesium forming a P-type dopant, the concentration of activated magnesium in this layer of GaN 14 being at least equal to $1*10^{17}$ cm$^{-3}$ and at most equal to $1*10^{18}$ cm$^{-3}$, this layer of GaN 14 having a thickness of between 10 and 50 nm.

With such a configuration according to the invention, it is possible to obtain a complete depletion of the layer 14, and an absence of diffusion of the magnesium to the electron gas layer 18. Such an absence of diffusion of magnesium to the electron gas layer 18 avoids electrical effects that are harmful to said electron gas layer, in particular for a high diffusion potential value of the P/N junction formed at the interface between the layers 14 and 15.

In the example illustrated in FIG. 1, the transistor 1 advantageously comprises a layer 19 of GaN formed in a manner that is known per se on the layer 17. The layer 19 makes it possible to avoid an oxidation of the layer 17 of AlGaN in this example. The layer 19 has for example a thickness of between 1 and 3 nm. The layer 19 is advantageously covered with a passivation layer 20, for example of silicon oxide or of silicon nitride.

It is also possible to have a layer 20 of silicon nitride on the layer 17, instead of the layer 19, deposited in situ in the frame used for the epitaxy steps, in order to have an SiN/AlGaN interface and a SiN layer of very good quality.

In a manner that is known per se, the transistor 1 comprises a source 21, a drain 22 and a control gate 3. The source 21 and the drain 22 are formed on the layer of AlGaN 17 and exhibit a linear current-voltage electrical characteristic (ohmic). The source 21/electron gas layer 18 contact resistance and the drain 22/electron gas layer 18 contact resistance are low and typically between 0.5 and 1 ohm·mm. The source 21, the drain 22 and the control gate 3 are illustrated only schematically, their dimensions and their structures being able to differ greatly from the illustration of FIG. 1.

A cavity is formed through the layer of AlGaN 17 and through the layer of GaN 16. The cavity extends just into the layer of GaN 15 but without passing through it. N-doped GaN thus delimits the bottom of this cavity. In the present example, the cavity also passes through the layers 19 and 20.

The control gate 3 includes a gate insulation layer 32 and a conductive gate material 31 (the work function of which is advantageously high). The gate insulation 32 electrically insulates the gate conductor 31 relative to the layers 15, 16 and 17 in particular. The gate insulation 32 here covers the bottom and the side walls of the cavity. The gate insulation 32 is thus in contact with the layer 15 in the bottom of the cavity, and in contact with the layers 15, 16 and 17 at the side walls of the cavity. The gate insulation 31 can for example be produced in Al$_2$O$_3$.

The gate material 31 is arranged in the cavity, in a space not occupied by the gate insulation 32. The gate material is separated from the layers 15, 16 and 17 via the gate insulation 32. The gate material 31 is in contact with the gate insulation 32. The gate material 31 is for example metal, including, for example, TiN, W, or Ni (metals with high work function).

Hereinbelow, the channel will be designated as the zone of the layer of GaN 15 in which the conduction is controlled by the gate 3. The ports of the transistor 1 include the zones between control gate 3 and drain 22, and between control gate 3 and source 21, including the electron gas layer 18. The transistor 1 according to the invention aims to ensure an electron gas conduction at the ports and operation of accumulation field-effect transistor type in the channel.

The superposition of the layer of P-doped GaN 14 with the layer of N-doped GaN 15 makes it possible to form a depleted P/N junction, so as to form a barrier of particularly high potential under the electron gas layer. Thus, at the ports, the junction formed makes it possible to contain the electrons in the layer 16 and thus avoid the trapping thereof in lower layers, in particular the layer 13 which can include a large number of traps because of a potentially high carbon concentration.

The P/N junction formed can be fully depleted with appropriate dopant thicknesses and concentrations in the layers 14 and 15. Furthermore, such a junction is formed with materials compatible with the layer of unintentionally doped GaN 16 intended to form the electron gas layer. Such a junction can be obtained from a formation of the layers 14 and 15 by epitaxy.

The N-doped layer 15 makes it possible to separate the design of the ports and of the channel. The layer 15 absorbs the Vbi potential (detailed hereinbelow) at the ports, and makes it possible to fabricate the channel independently of the electron gas 18. Furthermore, such a potential barrier makes it possible to avoid the formation of a layer of AlGaN under this layer of unintentionally doped GaN 16, which makes it possible to limit the mechanical constraints at the interface with this layer of GaN 16.

Moreover, under the gate 3, there is the benefit of the depletion of the N-doped GaN of the channel, which makes it possible to form a transistor of normally off type with a high threshold voltage, easily higher than 3V. As detailed hereinbelow, the N-doped GaN of the channel is depleted under the action of the P-doped GaN and of the conductive gate material 31. To make the channel conductive, enough electrons have to be accumulated in the channel under the gate 3, via a potential difference between source and gate higher than the threshold voltage. As detailed hereinbelow, the threshold voltage Vth of the transistor 1 can be adjusted by acting in particular on the various technological parameters.

In the on state, the density of electrons and the mobility thereof are greater than those obtained for an inversion channel. Moreover, the dissociation of the channel and the ports avoids damage to the performance levels of the transistor 1 in the on state. The substrate 11 can be an insulator or a semiconductor of intrinsic or doped silicon type, SiC or sapphire (monocrystalline Al$_2$O$_3$). The substrate 11 can typically have a thickness of the order of 500 µm to 1 mm.

The nucleation layer 12 deposited on the substrate 11 serves as intermediary between this substrate and the buffer layer 13 of GaN, to promote a growth by epitaxy of the buffer layer 13. Such a nucleation layer 12 proves particularly advantageous in the case of greatly mismatched mesh and CTE (coefficients of thermal expansion or dilation) parameters between the layer 13 and the substrate 11, which could make it impossible to produce the heterostructure with sufficient quality to fabricate the components. The nucleation layer 12 is for example made of AlN. The nucleation layer 12 for example has a thickness of 100 nm.

The layer of GaN 13 is for example carbon-enriched in order to increase its electrical resistivity. A carbon-enrichment can for example be produced simultaneously with a growth by epitaxy of the layer 13. The layer 13 typically has a thickness of 1 to 15 μm based on the voltage range targeted for the transistor component 1.

The layer of P-doped GaN 14 has a thickness of between 10 and 50 nm and a concentration of P dopants of $1*10^{17}$ $cm^{-3}$ to $1*10^{18}$ $cm^{-3}$. The layer of N-doped GaN 15 has for example a thickness of 80 nm and a concentration of N dopants of $2*10^{16}$ to $2*10^{17}$ $cm^{-3}$. The layers 14 and 15 have a carbon concentration lower than that of the layer 13. This concentration is for example of the order of $10^{16}$ $cm^{-3}$.

The layer of unintentionally doped GaN 16 for example has a thickness of 50 nm. In order to promote maximum electron mobility in the electron gas layer 18, the layer of GaN 16 has a doping that is as low as possible. It will for example be considered that a layer 16 is unintentionally doped if the concentration of N and P dopants is lower than $1*10^{16}$ $cm^{-3}$. Another criterion for the unintentionally doped layer is that its concentration of N and P dopants is lower than the concentration of N-doped dopants of the layer 15. The layer of AlGaN 17 for example has a thickness of 25 nm. In the example illustrated, the barrier layer 17 is formed in AlGaN. According to the invention, any other semiconductor layer can be arranged on the layer 16 of unintentionally doped GaN, if it is suitable for generating an electron gas at their interface. The layer 17 can for example be another ternary alloy of III element nitride. The layer 17 can also be a binary alloy of III element nitride, for example of AlN. In the example, the AlGaN of the layer 17 can comprise a molar fraction of AlN of between 15 and 25%, but other proportions can of course be used.

The doping of the P-doped layer 14 is produced with magnesium, a material which can easily be integrated in the layer 14 in a possible formation by epitaxy. Furthermore, the magnesium can easily be activated (that is to say serve its acceptor function). Advantageously, the doping of the N-doped layer 15 is produced with silicon, a material that can easily be integrated in the layer 15 in a possible formation by epitaxy.

Figure 2:
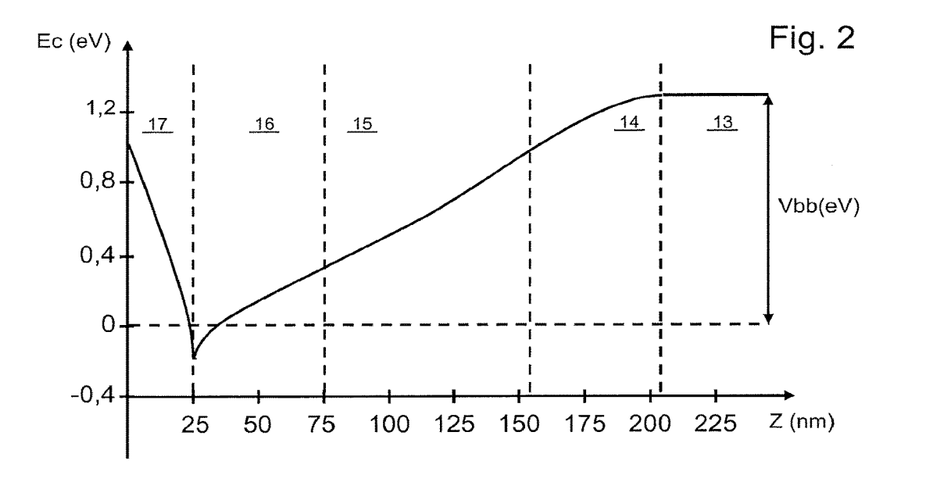
FIGS. 2 and 3 are conduction band diagrams of a transistor according to the invention and of a transistor according to the prior art.
Figure 3:
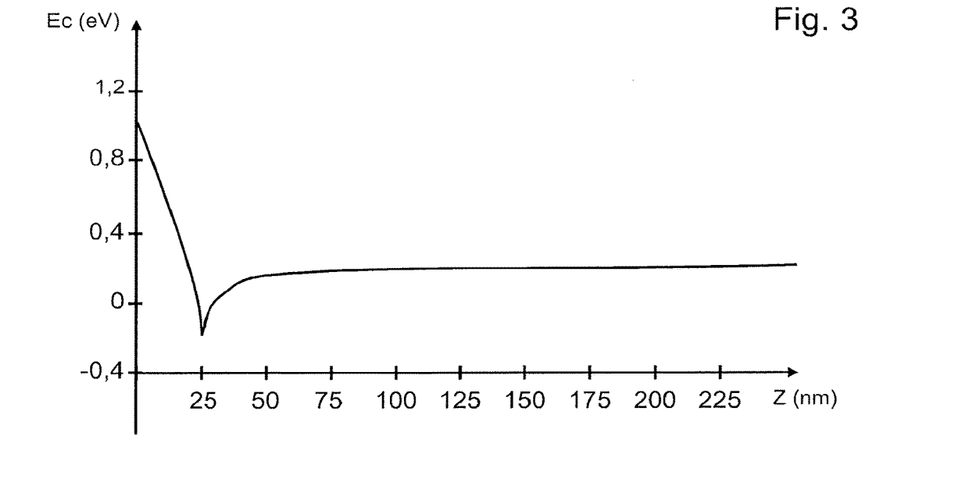

FIG. 2 is a conduction band diagram of the transistor 1 detailed previously as a function of the depth, at the ports. By way of comparison, FIG. 3 provides a conduction band diagram of a prior art transistor as a function of the depth at the ports. The prior art transistor taken into account comprises a 25 nm layer of AlGaN formed on a layer of unintentionally doped GaN that is 1.40 μm thick.

It is found that the potential barrier for the transistor 1 according to the invention is typically at least equal to 1.3 eV and above, depending on the P and N doping concentration selected. By contrast, the potential barrier of the prior art transistor is approximately 0.15 eV. The transistor 1 according to the invention thus makes it possible to obtain a particularly high potential barrier to avoid the injection, and consequently the trapping, of the electrons of the electron gas layer 18 in the layer 13 for example. Simulations have made it possible to determine that the density of electrons in the respective electron gas layers of these transistors are substantially equivalent, approximately $8.5*10^{12}$ $cm^{-2}$ for the transistor of the example of FIG. 3 compared to approximately $8.2*10^{12}$ $cm^{-2}$ for the transistor of the example of FIG. 2. The density of electrons of the electron gas layer 18 according to the invention is therefore still particularly high.

The influence of the various parameters of the layers 14, 15 and 16 on the formation of a potential barrier for the electron gas layer 18 and the layer of GaN 16 will be detailed more hereinbelow.

To make it possible to anticipate the influence of various parameters on the performance levels of the transistor 1 according to the invention, the following notations will be used hereinbelow:

Ns: the density of electrons in the electron gas layer (in $cm^{-2}$);

$\mu_{2DEG}$: the mobility of the electrons in the electron gas layer (in $cm^2/Vs$);

$N_D$: the volume density of donors in the layer of N-doped GaN 15 (in $cm^{-3}$);

$N_A$: the volume density of acceptors in the layer of P-doped GaN 14 (in $cm^{-3}$);

$N_{A-}$: the volume density of acceptors in a thick layer of P-doped GaN that is thick enough to be not depleted (in $cm^{-3}$);

$N_{D+}$: the volume density of donors in a thick layer of N-doped GaN that is thick enough to be not depleted (in $cm^{-3}$);

ni: the density of intrinsic carriers in a layer of GaN at room temperature (in $cm^{-3}$);

RT: the room temperature taken into account of 298K;

T: the temperature of the substrate in K;

Ron: the resistance of the transistor 1 in the on state;

Nsc: the density of electrons in the channel of the transistor 1 (in $cm^{-2}$);

μc: the mobility of the electrons in the channel (in $cm^2/Vs$);

Wn: the thickness of the layer of N-doped GaN under the control gate;

Wnepi: the thickness of the layer of N-doped GaN 15;

Wnid: the thickness of the layer of unintentionally doped GaN 16;

Wp: the thickness of the layer of P-doped GaN 14;

Wt: the thickness of the transition zone between the electron gas layer 18 and the part forming a channel in the GaN layer 16;

tox: the thickness of the gate insulation;

Vbi: the diffusion potential (designated by the potential term "built-in") of the P/N junction formed at the interface between the layers 14 and 15;

Vbbpn: the potential barrier at the terminals of the depleted P/N junction;

Vbbnid: the potential barrier at the terminals of the layer of unintentionally doped GaN 16;

Vbb: the total potential barrier;

Lg: the length of the control gate 3;

Lgeff: the length of the control gate 3 increased by the transition zones on source and drain side (Lgeff≈Lg+2 Wt);

Lds: the drain-source distance of the transistor 1;

$\varepsilon_0$: the vacuum permittivity;

$\varepsilon_{sc}$: the permittivity of the GaN;

$\varepsilon_{ox}$: the permittivity of gate oxide or insulation used;

k: the Boltzman constant=1.3806488 $E^{-23}$ J/K q: the electron charge≈1.6 $E^{-19}$ C.

The behaviour of the junction between the layers 14 and 15 will be modelled in the absence of potential difference between the source 21 and the control gate 3. The diffusion potential of the junction between the layers 14 and 15 can be defined as follows:

$$V_{bi(T)} = \frac{k \cdot T}{q} \ln\left(\frac{N_{A(T)}^- \cdot N_{D(T)}^+}{n_i^2(T)}\right)$$

With a P doping produced with magnesium, the ionization energy of the Mg acceptor in the GaN is approximately 180 meV. The ionization is therefore partial at the temperature RT. It is therefore necessary to take this into account by the inequality $N_{A-} < N_A$ at the temperature RT.

With $n_i \approx 1.9\ e^{-19}\ cm^{-3}$ at the temperature of 298K, Vbi takes values of 3.1+/−0.1 V for useful values of $N_D^+$ and $N_A^-$. Vbi remains not very sensitive to the variations of $N_{A-}$ and $N_{D+}$ because of the logarithm in the relationship. The threshold voltage Vth of the transistor 1 (formula detailed hereinbelow) is therefore relatively insensitive to the concentration of dopants in the layers 14 and 15.

To guarantee the absence of conduction in the channel when the potential difference Vgs between gate and source is nil, the positive charges developed in the GaN layer 15 are made to be insufficient to balance the negative charges developed in the GaN layer 14. This condition can in particular be fulfilled by means of a relatively thin GaN layer 15.

This condition can for example be expressed by the following inequality, with Wn0, the thickness of GaN with N doping being able to be depleted by the layer of GaN 14 with P doping.

$$W_n < W_{n0} = \sqrt{\frac{2\varepsilon_s \cdot V_{bi} \cdot N_A}{q \cdot N_D \cdot (N_A + N_D)}}$$

Figure 4:
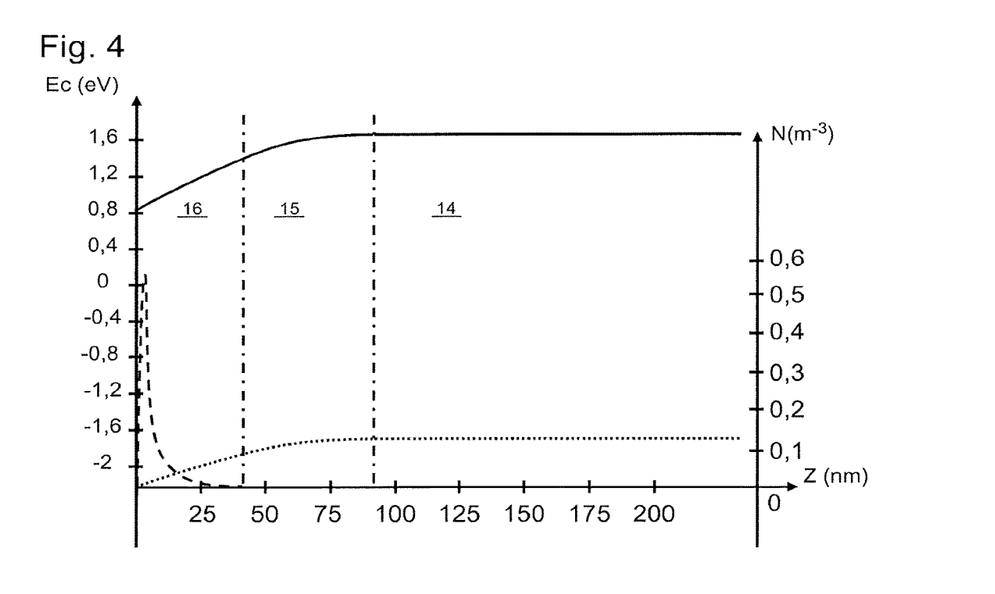
FIG. 4 is a diagram illustrating an electron density, a conduction band and a valence band under the gate of an example of a transistor according to the invention.

The diagram of FIG. 4 illustrates, by solid line, the conduction band of the transistor 1 detailed previously as a function of depth, at the channel and under the gate 3. The diagram of FIG. 4 also illustrates by dotted lines the valency band as a function of the depth under the gate 3. FIG. 4 also illustrates, by discontinuous line, the density of electrons as a function of the depth under the gate, in the absence of potential difference Vgs. The density of electrons under the gate 3 is thus extremely reduced (to the maximum of $5.5\ e^{-6}\ cm^{-2}$).

By application of a potential difference Vgs higher than Vth, it is possible to obtain a conducting channel by the appearance of an electron accumulation layer in the layer 15 under the gate insulation 32.

The threshold voltage Vth can be calculated by the following formula:

With $\varphi_{MS}$ the work function difference between the layer of GaN 15 and the gate conducting material 31, with a value of approximately 1 eV in the present case. This contribution $\varphi_{MS}$ to the threshold voltage can be expressed as the depletion by the gate.

The second term corresponds to the effect of the diffusion potential Vbi on the P/N $$V_{th} = \varphi_{MS} + \left(\frac{\varepsilon_s}{\varepsilon_{ox}} \cdot \frac{V_{bi}}{W_n} - \frac{\eta \cdot N_d \cdot W_n}{2\varepsilon_0 \cdot \varepsilon_{ox}}\right) \cdot t_{ox} \approx \varphi_{MS} + V_{bi} \left(\frac{\frac{t_{ox}}{\varepsilon_{ox}}}{\frac{W_n}{\varepsilon_s}}\right)$$

junction. The third term corresponds to the positive space charge developed in the layer 15 under the gate 3.

Also, the threshold voltage Vth is designed to be all the higher when the Wn value (thickness of the layer 15 under the gate 3) is low. With Wn<<Wn0, the third term becomes almost negligible in relation to the second term.

It can also be seen that, in the approximate Vth formula, the weighting coefficient of the Vbi is the ratio of the actual thicknesses of the oxide and of the layer n 15.

In the particular case of $Al_2O_3$ chosen as gate insulation 32, with $tox \geq Wn$, a threshold voltage offset of at least 3.1V is obtained. Therefore $Vth \geq \varphi_{MS} + 3.1V$.

Consequently, a Vth value higher than 3V can easily be obtained. The Vth value can easily be adjusted industrially by choosing, for example, appropriate values of Wn and tox.

The channel port zones on source and drain side are formed by the electron gas layer 18 and exhibit a lower resistance in the on state. The concentration and above all the effective mobility of the electrons in the channel when Vgs>Vth remain lower than those of the electrons in the electron gas layer 18 at the ports. Consequently, to reduce the resistance Ron of the transistor in the on state as much as possible, it is desirable to reduce the gate length as much as possible relative to the drain-source distance Lds. For example, for applications where Lds is of the order of 20 μm, it is desirable to use a gate length Lg less than 1 μm.

To calculate the resistance in the on state of the transistor, an effective gate length Lgeff is taken into account, defined approximately as the length Lg of the control gate 3 increased by the transition zones on source and drain side, i.e. Lgeff≈Lg+2 Wt. The gate length Lg will be less constrained for high voltage applications (for example voltages higher than 600V).

To retain a low channel resistance in the on state, the following relationship will preferably be observed:

$$L_{geff} \ll \frac{N_{sc} \cdot \mu_c \cdot L_{ds}}{N_s \cdot \mu_{2DEG}}$$

For standard values of Nsc and μc, it is possible to deduce the condition Lgeff<1 μm and therefore Lg<0.8 μm. It will for example be possible to choose an Lg value lying between 0.25 and 0.5 μm. An Lg value at least equal to 0.25 is preferably retained, tox having to be high enough to retain a Vgs variation band of +/−15V or +/−20V, similar to what is obtained with a gate for a transistor of silicon type.

At the ports, the capacity to withstand the voltage in off mode is high, by virtue of the high critical electrical field of the material of the GaN.

The potential barrier formed between the electron gas layer 18 and the buffer layer 13 (preventing the injection and the trapping of the electrons in the deep layers of the buffer layer 13) reaches a high level and appears by virtue of the diffusion potential Vbi, and includes:

partly, a potential barrier at the terminals of the depleted P/N junction formed between the layers 14 and 15:

$$V_{bbpn} = \frac{q}{2\varepsilon_s}(N_A \cdot W_p^2 + 2N_A \cdot W_p \cdot W_n - N_D \cdot W_n^2)$$

partly, a potential barrier at the terminals of the GaN layer 16:

$$V_{bbnid} = \frac{q}{\varepsilon_s}(N_A \cdot W_p - N_D \cdot W_n) \cdot W_{nid}$$

In the space charge zone of the p/n junction, all the acceptors and donors are ionized and it is therefore their total concentration which is applied in the calculations (that is to say $N_A$ and $N_D$).

With Wnepi=80 nm and Wp=50 nm and $N_A=1e^{17}$ cm$^{-3}$, a potential barrier of approximately 1.3 eV is obtained, including 0.9 eV at the terminals of the junction and 0.3 eV at the terminals of the layer 16.

The potential barrier obtained by the combination of the layers 14 and 15 reaches a higher level than that of a possible layer of AlGaN which would be placed under the electron gas formation layer 16 (like the example detailed in "Characteristics of AlGaN/GaN/AlGaN double heterojunction HEMTs with an improved breakdown voltage" cited in the introduction).

Examples of design rules for such a transistor 1 are supplied hereinbelow.

When the dopant of the layer 14 is magnesium, the extreme limits for $N_A$ are set by:

the capacities of the epitaxy technology to incorporate and activate the magnesium in the layer 14 of GaN (by taking into account a solubility limit and the passivation by complexes of Mg—H type in particular). The maximum value that can be used for $N_A$ is currently a priori $1e^{19}$ cm$^{-3}$ the value necessary to have a Vbi>3V, i.e. $N_A>3e^{16}$ cm$^{-3}$ It is theoretically possible to design a transistor 1 according to the invention in this range of values. In practice, a concentration $1e^{17}$ cm$^{-3} < N_A < 1e^{18}$ cm$^{-3}$ will advantageously be used. $N_A > 1e^{17}$ cm$^{-3}$ makes it possible to obtain a significant buried potential barrier, or back barrier (>1.3V) and $N_A < 1e^{18}$ cm$^{-3}$ makes it possible to obtain a robust thickness for the layer p14 (Wp>15 nm).

Figure 8:
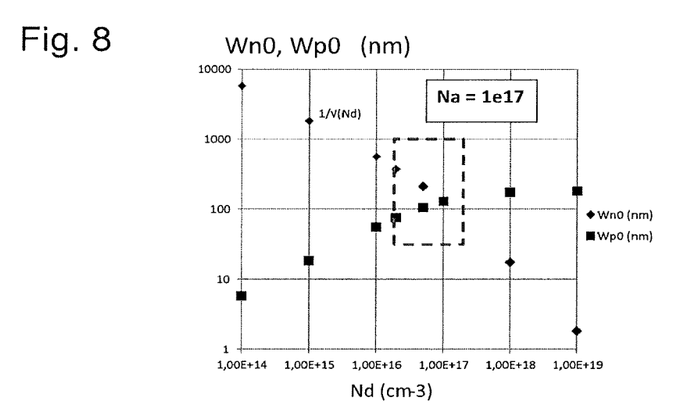
FIGS. 8 and 9 illustrate thickness values of certain layers according to their dopant concentrations.
Figure 9:
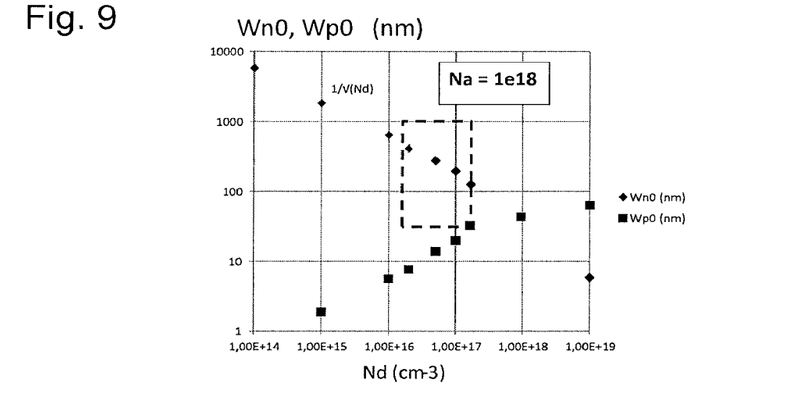

For the layer 15, it is for example possible to select an $N_D$ value lying between $2e^{16}$ cm$^{-3}$ (for $N_A=1e^{17}$ cm$^{-3}$) and $2e^{17}$ cm$^{-3}$ (for $N_A=1e^{18}$ cm$^{-3}$) The maximum value of $N_D$ is for example limited by the loss of mobility of the electrons of the channel which would then degrade Ron, particularly if $N_D > 2e^{17}$ cm$^{-3}$. The minimum value of $N_D$ is determined by the value of $N_A$: the higher the value of $N_A$, the greater the value of $N_D$ must be, otherwise Wp0 (and therefore Wp) is too low to allow the formation of the p-GaN layer 14. The Wp0 and Wn0 curves as a function of $N_D$ for the extreme values of $N_A$ summarize this aspect (as illustrated in FIGS. 8 and 9). Once $N_A$ is chosen, the dotted line zone delimits the possibilities for $N_D$.

Example 1: if $NA=1^e17$, it is possible to choose ND to be between $2^e16$ and $1^e17$. $2^e16$ will be chosen if the mobility in the channel is to be prioritized.

Example 2: if $NA=1^e18$, it is possible to choose $ND=2^e17$ to avoid a Wp value that is too low.

The minimum value of $N_D$ is also defined by the capacity to produce weak dopings of N type in GaN, and by the reduction of the value $\varphi_{MS}$ (and therefore of the value Vth) if Nd is too low. Therefore, preferably, $N_D \geq 2e^{16}$ cm$^{-3}$.

It is then possible to calculate the diffusion potential Vbi according to the relationship detailed previously. It is then possible to calculate a corresponding thickness Wn0 of total depletion in a GaN-n layer 15 of $N_D$ doping (for example 375 nm with parameters detailed previously) and a corresponding thickness Wp0 of total depletion in a GaN-p layer 14 (for example 75 nm with parameters detailed previously and the following relationship).

$$W_{p0} = \sqrt{\frac{2\varepsilon_s \cdot V_{bi} \cdot N_D^+}{q \cdot N_A^- \cdot (N_A^- + N_D^+)}}$$

It is then possible to determine the thicknesses of the channel and of the GaN layers 15 and 14 to be produced for the latter to be fully depleted, by observing only the following inequalities:

Wn0≥Wnepi;
Wn0>Wn; and
Wp0>Wp

The layer of GaN 14 is advantageously fully depleted, to avoid retaining a conducting layer of holes which would prevent the electrical field from developing in the thickness of the layer of GaN 13, which would induce a strong degradation of the voltage withstand strength of the transistor.

With Vbi=3V, $N_A=1*10^{17}$ cm$^{-3}$ and $N_D=2*10^{16}$ cm$^{-3}$, a Wp0 value of 75 nm is obtained. A Wp value is advantageously used that is high enough to be able to be produced by epitaxy with robustness (for example Wp>15 nm). A reduction of the Wp value lowers the level of the potential barrier. On the other hand, a reduction of the Wp value guarantees the depletion of the layer of GaN 14. Advantageously, Wp lies between 30 and 50 nm, and is preferably equal to 50 nm.

At the ports, the thickness of the layer of GaN 15 is defined as Wnepi. The following dimensioning rules aim to fully deplete the layer of GaN 15, whether at the ports or in the channel. For simplification it will be possible to consider that the thickness of the layer of GaN 15 corresponds to its thickness at the ports.

Advantageously, Wnepi≥0.2*Wn0 or Wnepi≥75 nm, to avoid the depletion having an impact on the electron gas layer 18. In effect, the layer 15 must absorb a non_negligible proportion of the diffusion potential Vbi. A thickness Wnepi that is high enough is also used for the potential barrier generated by the junction to be sufficient to prevent the injection of electrons with a sufficient space charge developed in the layer 15. Moreover, to allow for an etching of the cavity of the gate 3 in the layer 15 with sufficient margin, the inequality Wnepi>Wn+20 nm will preferably be borne out. A Wnepi value of 80 nm is for example satisfactory.

Moreover, it is desirable to limit the resistance of the transition zones between the electron gas layer 18 and the channel. To avoid increasing the effective gate length, the Wnepi thickness is advantageously minimized.

Advantageously, Wn is very much lower than Wn0 (for example Wn0≥4*Wn), such that the channel in the layer of GaN 15 is fully depleted under the electrodes of the transistor 1 and such that the threshold voltage Vth detailed previously is not degraded. For example, for a Wn0 value of 373 nm, it is possible to choose a Wn value less than 93 nm. Moreover, if the permittivities of the insulation 32 and of the GaN are close, to obtain a high Vth, it is desirable to observe the relationship 50 nm tox Wn. For example, it is possible to choose the Wn value between 20 and 50 nm. A value of 40 nm for example proves appropriate. The minimum value of Wn is for example defined by the fabrication method constraints. Thus, to etch the layer 17 of AlGaN, the layer 16 of GaN and a part of the layer 15 of GaN, it is necessary to envisage an etch of approximately 150 nm to form the cavity of the gate 3. In the absence of a stop layer, it is preferable to retain a channel of a thickness Wn of at least 20 nm to take account of the inaccuracy on the depth of the etch. The minimum value of Wn is also set by the maximum value of Vth. Since Vth is dependent on the ratio tox/Wn, with a maximum Vth value of 6V and a capped tox value, it is deduced therefrom that Wn must for example be at least equal to 20 nm. The depth of implantation Wt of the gate 3 in the layer 15 is preferably non-nil, advantageously at least 20 nm, even at least 30 nm. A depth of implantation of 40 nm for example proves appropriate.

For a desired Vth value, having defined the Wn and $\varphi_{MS}$ values, it is possible to deduce the tox value for the layer of insulation 32, from the relationship supplied previously for Vth.

The thickness of the layer 16 is advantageously thick enough to avoid any disturbance of the electron gas layer 18 at the electrodes of the transistor 1 by chemical influence (the deposition of the magnesium-doped layer inducing a magnesium memory effect in the layers subsequently deposited by epitaxy) and by electrical influence of the dopants of the layers 14 and 15. Thus, advantageously, 60 nm≥Wnid 20 nm (for example obtained with Wnepi=80 nm and Wnepi+Wnid≥100 nm to limit the influence of the magnesium on the electron gas layer 18). To limit the resistivity of the transition zones between the electron gas 18 and the channel, advantageously, the inequality 100 nm>Wnepi−Wn+Wnid is advantageously observed.

Advantageously, Wnid=50 nm.

The layers 12 to 18 can be formed successively in one and the same epitaxy machine in vapour phase (MOCVD), by obviously changing the epitaxy conditions for each of the layers. The epitaxy parameters for the formation of each of the layers are known per se to those skilled in the art.

The tox thickness can be limited by the insulation 32 fabrication method. For example, a layer of $Al_2O_3$ deposited by an ALD (Atomic Layer Deposition) technique is difficult to produce on a thickness exceeding 50 nm. The minimum tox thickness is imposed by the voltage withstand strength of the gate 3 in the on state and in the off state. For an insulation 32 of $Al_2O_3$, a tox thickness at least equal to 40 nm can prove necessary for voltages at least equal to 600V and a Vgs variation band of +/−20V. A tox value of 40 nm generally proves appropriate for $Al_2O_3$. Other materials for the gate insulation 92 can be used, for example (and in a nonlimiting manner) SiN, $SiO_2$, AlN, $AlO_xN$ or $HfO_2$.

To obtain a maximum Vth value, it is possible to use a metal as conductive material 31 exhibiting a high work function, for example Ni. Other compatible metals with CMOS technologies can also be used, of which nonexhaustive examples are W, Ti, P+ doped polysilicon or TiN. It is also possible to envisage a p+ diamond gate with an ohmic contact on the diamond produced from annealed Ti, to obtain a particularly high $\varphi_{MS}$ value.

Figure 5:
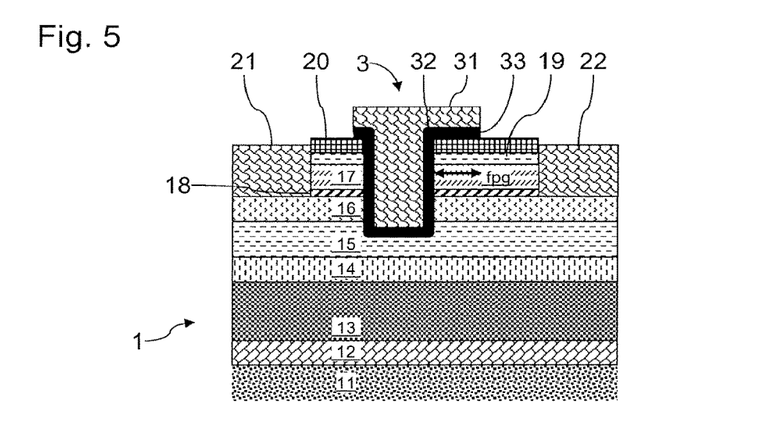
FIG. 5 is a cross-sectional view of a variant of a transistor according to the invention.

FIG. 5 is a schematic cross-sectional view of a variant transistor 1 intended to increase its voltage withstand strength. This variant proves particularly appropriate when the gate length is reduced, for example less than 0.5 μm. This variant includes a control gate 3 comprising a field electrode or FPG (Field Plate Gate).

The gate 3 of the transistor 1 here comprises a lateral overlap 33 above the layer 17 (and in this case above the layers 19 and 20). This lateral overlap extends by approximately a length fpg relative to the cavity of the gate 3. Thus, the gate conductive material 31 and the gate insulation 32 extend laterally by a length fpg relative to the cavity of the gate 3. The geometry of the field electrode is advantageously optimized (length, height) in a manner known per se to those skilled in the art in order to reduce the electrical field peak at the foot of the gate.

Figure 6:
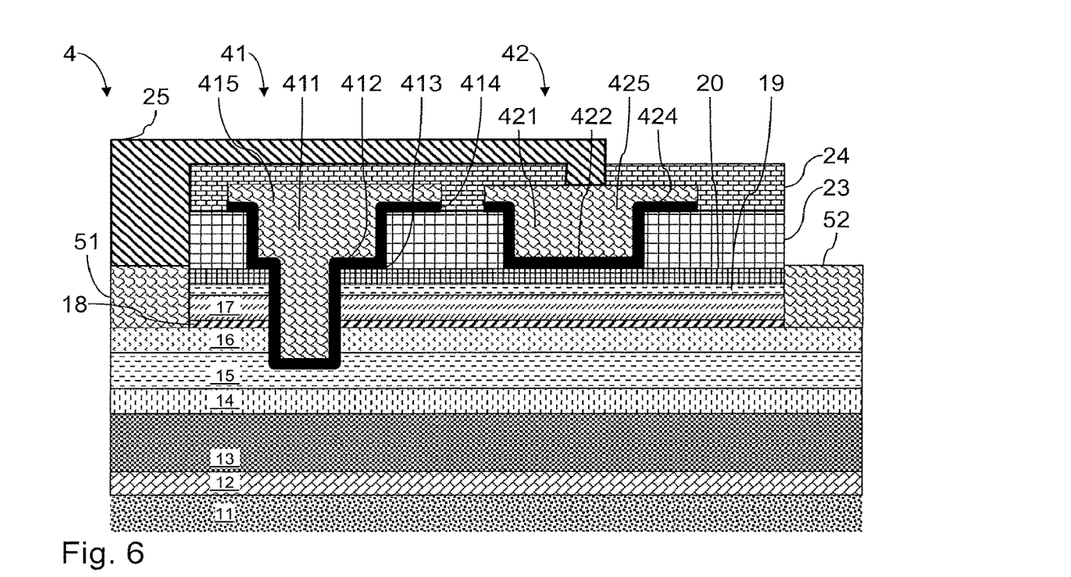
FIG. 6 is a cross-sectional view of a cascode structure including a transistor according to the invention.
Figure 7:
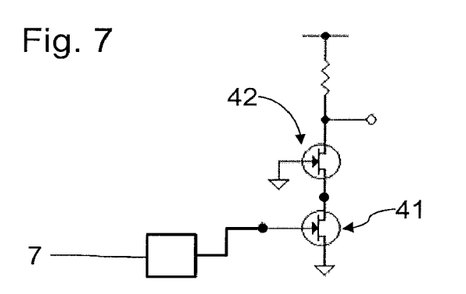
FIG. 7 is an equivalent circuit diagram of the cascode structure of FIG. 6.

FIG. 6 is a schematic cross-sectional view of a cascode structure 4 including a transistor of normally-off type according to the invention. FIG. 7 is an equivalent circuit diagram of this cascode structure 4. Such a structure proves also particularly appropriate for a transistor of normally-off type whose gate length is reduced in the cavity passing through the electron gas layer, for example less than 0.2 μm. Such a cascode structure 4 makes it possible to increase the voltage withstand strength despite the use of a short gate normally-off transistor.

The cascode structure 4 includes high electron mobility heterojunction transistors 41 and 42 connected in series. The transistor 41 is of normally-off type, the transistor 42 being of normally-on type. The control gate 415 of the transistor 41 is driven in a manner that is known per se by a control circuit 7, via a connection not illustrated in FIG. 6. The source 51 of the transistor 41 is connected to the control gate 425 of the transistor 42. The drain 52 of the transistor 42 constitutes an output electrode of the cascode structure 4.

The layer 20 is covered with an insulation layer 23. This layer 23 is for example produced in silicon oxide and can for example have a thickness of approximately 400 nm.

The control gate 415 is formed in particular in a cavity passing through the layers 16 and 17, and extending just into the layer 15. The cavity is covered with a layer of insulation 412 and filled with a gate conductive material 411. The gate 415 also passes through the layer of insulation 23.

The gate 415 of the transistor 41 here comprises a lateral overlap 413 above the layer 17 (and in this case above the layers 19 and 20). The control gate 415 thus comprises a field electrode or FPG (Field Plate Gate). This lateral overlap 413 extends by approximately a length fpg relative to the cavity of the gate 415. Thus, the gate conductive material 411 and the gate insulation 412 extend laterally by a length fpg relative to the cavity of the gate 415. The geometry of the field electrode is advantageously optimized (length, height) in a manner known per se to those skilled in the art in order to reduce the electrical field peak at the foot of the gate. As in the example illustrated in FIG. 5, the gate conductive material 411 and the gate insulation 412 extend laterally relative to the cavity of the gate 415. The gate 415 further comprises a lateral overlap 414 above the layer 23. The conductive material 411 and the insulation 412 extend laterally relative to the overlap 413.

The control gate 425 is formed in a cavity passing through the layer 23 and extending to the layer 20. The cavity is covered with a layer of insulation 422 and filled with a gate conductive material 421. The combination of the gate insulation 422 and of the layer 20 here has a bottom in contact with the layer 19. The gate 425 comprises a lateral overlap 424 above the layer 23. The conductive material 421 and the insulation 422 extend laterally relative to the cavity of the gate 425. Here, the gates 415 and 425 are covered with a layer of insulation 24. This layer of insulation 24 has, for example, a thickness of 200 nm and can, for example, be produced in silicon oxide. Interconnect metal 25 here connects the control gate 425 to the source 51.

The gates 415 and 425 are produced without an additional step in the transistor 1 fabrication method, which is advantageous for the fabrication cost thereof.

The drain of the transistor 41 and the source of the transistor 42 are advantageously confounded, their connection being produced in the electron gas layer 18. The cascode structure 4 obtained is thus particularly compact and exhibits a resistance in the on state that is relatively low. The drain of the transistor 41 and the source of the transistor 42 form a floating node.

The invention claimed is:

1. A high electron mobility field-effect transistor of normally-off type, comprising:
    a first layer of GaN with P-type doping, including magnesium forming a P-type dopant, the concentration of activated magnesium in the first layer of GaN is at least equal to $1*10^{17}$ cm$^{-3}$ and at most equal to $1*10^{18}$ cm$^{-3}$, said first layer of GaN having a thickness of between 10 and 50 nm;
    a second layer of GaN with N-type doping formed on the first layer of GaN so as to form a depleted p/n junction;
    a third layer of unintentionally doped GaN formed on the second layer of GaN;
    a semiconductor layer formed plumb with the third layer of unintentionally doped GaN to form an electron gas layer;

a cavity formed through said third layer of GaN, and extending to the second layer of GaN without reaching the bottom of this second layer of GaN;

a gate including a conductive gate material and a gate insulation layer arranged in said cavity, said gate insulation layer electrically insulating said conductive gate material relative to said second and third layers of GaN.

2. The high electron mobility field-effect transistor according to claim 1, in which said first layer of GaN is formed on a fourth layer of GaN having a carbon concentration greater than that of the first and second layers of GaN.

3. The transistor according to claim 1, in which the second layer of GaN includes silicon forming an N-type dopant.

4. The transistor according to claim 3, in which the silicon concentration in the second layer of GaN is at least equal to $2*10^{16}$ cm$^{-3}$ and/or at most equal to $2*10^{17}$ cm$^{-3}$.

5. The transistor according to claim 3, wherein the silicon concentration in the second layer of GaN is $2*10^{16}$ cm$^{-3}$ to $2*10^{17}$ cm$^{-3}$.

6. The transistor according to claim 1, in which said second layer of GaN has a thickness of between 50 and 100 nm.

7. The transistor according to claim 1, in which the concentration of N-type dopants in the second layer of GaN is less than the concentration of P-type dopants in the first layer of GaN.

8. The transistor according to claim 1, in which said third layer comprises a concentration of dopants at least two times less than the concentration of dopants of the second layer of GaN.

9. The transistor according to claim 1, in which said third layer has a thickness of between 20 and 60 nm.

10. The transistor according to claim 1, in which said gate insulation layer has a thickness at least equal to 20 nm.

11. The transistor according to claim 1, in which said cavity extends into the second layer of GaN to a depth of at least 20 nm.

12. The transistor according to claim 11, in which the thickness of a channel formed in the second layer of GaN between said cavity and the first layer of GaN is at least equal to 20 nm.

13. The transistor according to claim 11, wherein the thickness of a channel formed in the second layer of GaN between the cavity and the first layer of GaN is 20 nm to 50 nm.

14. The transistor according to claim 1, in which said semiconductor layer includes an alloy of III-N type.

15. The transistor according to claim 1, in which said gate has a length of at most 0.8 µm.

16. The transistor according to claim 15, in which said gate exhibits an overlap relative to said cavity, the overlap extending plumb with said semiconductor layer.

17. The transistor according to claim 1, wherein the gate insulation layer has a thickness of 20 nm to 50 nm.

18. The transistor according to claim 1, wherein the cavity extends into the second layer of GaN to a depth of 20 nm to 40 nm.

* * * * *